(12) United States Patent
Pfaff et al.

(10) Patent No.: US 7,777,581 B2
(45) Date of Patent: Aug. 17, 2010

(54) VOLTAGE CONTROLLED OSCILLATOR (VCO) WITH A WIDE TUNING RANGE AND SUBSTANTIALLY CONSTANT VOLTAGE SWING OVER THE TUNING RANGE

(75) Inventors: Dirk Pfaff, Ottawa (CA); Volodymyr Yavorskyy, Waterloo (CA)

(73) Assignee: Diablo Technologies Inc., Gatineau, Quebec (CA)

( * ) Notice: Subject to any disclaimer, the term of this patent is extended or adjusted under 35 U.S.C. 154(b) by 39 days.

(21) Appl. No.: 11/984,852

(22) Filed: Nov. 23, 2007

(65) Prior Publication Data
US 2009/0102525 A1 Apr. 23, 2009

Related U.S. Application Data

(60) Provisional application No. 60/960,921, filed on Oct. 19, 2007.

(51) Int. Cl.
*H03L 5/00* (2006.01)
*H03L 7/14* (2006.01)

(52) U.S. Cl. .............................. 331/57; 331/16; 331/45; 331/186

(58) Field of Classification Search .................. 331/45, 331/57, 186, 16
See application file for complete search history.

(56) References Cited

U.S. PATENT DOCUMENTS

| | | | | |
|---|---|---|---|---|
| 5,475,344 | A * | 12/1995 | Maneatis et al. | 331/25 |
| 6,466,098 | B2 * | 10/2002 | Pickering | 331/25 |
| 7,321,269 | B2 * | 1/2008 | Drake et al. | 331/57 |
| 2007/0258491 | A1 | 11/2007 | Reitlingshoefer | |

OTHER PUBLICATIONS

B. Ganesh et al., "Fully-Buffered DIMM Memory Architectures: Understanding, Mechanisms, Overhead and Scalings", IEEE Int. Symp. On High Performance Computer Architecture, pp. 109-120, Feb. 2007.
Intel Corporation, "Intel 6400/6402 Advanced Memory Buffer Datasheet", pp. 38-42, Oct. 2006.
H. Partovi et. al, "Data Recovery and Retiming for the Fully Buffered DIMM 4.8Gb/s Serial Links", ISSCC Dig. Tech. Papers, pp. 336-337, Feb. 2006.
T. Toifl et al., "A 0.94-ps-RMS-jitter 0.016-mm2 2.5-GHz multiphase generator PLL with 360° digitally programmable phase shift for 10-Gb/s serial links", IEEE J. of Solid State Circuits, vol. 40, pp. 2700-2712, Dec. 2005.
"FB-DIMM High Speed Differential PTP Link at 1.5V—Specification", JEDEC, Sep. 2006, and Dec. 2005.

(Continued)

*Primary Examiner*—Robert Pascal
*Assistant Examiner*—James E Goodley
(74) *Attorney, Agent, or Firm*—IP-MEX Inc.

(57) ABSTRACT

A wide tuning range and constant swing VCO is described that is based on a multipass Ring Oscillator enhanced with feed-backward connections. This VCO is designed to overcome tuning range limitations of prior-art "feed-forward" ring oscillators. The Feedback multipass Ring Oscillator of the invention provides decreasing frequency when tuned by increasing the feedback, thus covering a much wider tuning range irrespective of the speed limit of the technology while at the same time providing almost constant amplitude.

15 Claims, 12 Drawing Sheets

OTHER PUBLICATIONS

Yalcin Alper Eken, Student Member, IEEE, and John P. Uyemura, Senior Member, IEEE, "A 5.9-GHz Voltage-Controlled Ring Oscillator in 0.18-um CMOS," in IEEE journal of solid-state circuits, vol. 39, No. 1, Jan. 2004, pp. 230-233.

Edoardo Prete, Dirk Scheideler, Anthony Sanders, "A 100mW 9.6Gb/s Transceiver in 90nm CMOS for next-generation memory interfaces," Infineon, Munich, Germany, ISSCC 2006 / Session 4 / Gigabit Transceivers / 4.5.

D.-Y. Jeong, S.-H. Chai, W.-C. Song, and G.-H. Cho, "CMOS current-controlled oscillators using multiple-feedback loop architectures," in IEEE Int. Solid-State Circuits Conf. Dig. Tech. Papers, 1997, pp. 386-387.

L. Sun, T. Kwasniewski, and K. Iniewski, "A quadrature output voltage controlled ring oscillator based on three-stage subfeedback loops," in Proc. Int. Symp. Circuits and Systems, Conf. Dig. Tech. Papers, 1997, pp. 386-387.

\* cited by examiner

VOLTAGE CONTROLLED OSCILLATOR (VCO) WITH A WIDE TUNING RANGE AND SUBSTANTIALLY CONSTANT VOLTAGE SWING OVER THE TUNING RANGE

RELATED APPLICATIONS

The present application claims priority from the U.S. provisional application Ser. No. 60/960,921 entitled "A Voltage Controlled Oscillator (VCO) and a Linear Phase Interpolator/ Phase Detector Combination, and a Multi-Phase Clock Generator Using the Same" filed on Oct. 19, 2007.

FIELD OF THE INVENTION

The present invention generally relates to clock generation in electronic equipment, specifically voltage controlled oscillators for use in phase lock loops (PPLs).

BACKGROUND OF THE INVENTION

Bandwidth and capacity of memory systems based on commodity dual-inline memory modules (DIMM) are severely limited by the parallel stub bus between the modules and the memory controller. In order to maintain signal integrity, the maximum number of DIMMs per channel had to be reduced with the market entrance of every new dynamic random access memory (DRAM) generation. Fully buffered DIMMs (FBDIMM) eliminate this limitation by replacing the parallel stub bus by a serial, point-to-point link with a repeater device (advanced memory buffer AMB) residing on every FBDIMM, see e.g., "FB-DIMM High Speed Differential PTP Link at 1.5V—Specification", JEDEC, December 2005. While solving the bandwidth-capacity problem, FBDIMM systems potentially increase the memory latency. Keeping the pass-through latency below 3 ns, combined with careful command sequencing alleviates only the latency problem as described in paper to B. Ganesh et al., "Fully-Buffered DIMM Memory Architectures: Understanding, Mechanisms, Overhead and Scalings", IEEE Int. Symp. On High Performance Computer Architecture, pp. 109-120, February 2007. The main barrier for the wide acceptance of FBDIMM, however, remains the high power consumption of the AMB. Current AMBs tend to consume more than 8 W, as shown in the document of Intel Corporation, "Intel 6400/6402 Advanced Memory Buffer Datasheet", pp. 38-42, October 2006, with the high speed serial link alone dissipating 4 W, as described in paper to H. Partovi et. al, "Data Recovery and Retiming for the Fully Buffered DIMM 4.8 Gb/s Serial Links", ISSCC Dig. Tech. Papers, pp. 336-337, February 2006. A significant reduction of AMB power consumption, and most importantly its high speed serial link delivering up to 115 Gb/s, remains a critical undertaking in the design of high bandwidth and high capacity memory systems.

The basic functionality of the AMB is described in more detail in the background section of the patent application Ser. No. 11/790,707 "PROGRAMMABLE ASYNCHRONOUS FIRST-IN-FIRST-OUT (FIFO) STRUCTURE WITH MERGING CAPABILITY" to Reitlingshoefer et al. filed Apr. 27, 2007, which is incorporated herein by reference. As described in this application, the AMB requires numerous timing alignment circuits, both for the serial data channels and for the common reference clock. The timing alignment circuits may each include a phase lock loop (PLL) which in turn may include a voltage controlled oscillator (VCO).

FIG. 1 is a block diagram of a conventional PLL 100 of the prior art, for generating a multiphase clock output 102 that is aligned in phase and frequency with a reference clock input 104. The PLL 100 comprises a phase/frequency detector (PFD) 106, a loop filter 108, a divide-by-Z circuit 110, and a VCO 112. The multiphase clock output 102 may be generated by decoding the states of the divide-by-Z circuit 110. An alternative multiphase clock output 102' may be obtained by decoding the states of the VCO 112, assuming the VCO 112 is constructed in a suitable configuration, for example on the basis of a ring oscillator.

FIG. 2 is a block diagram of a simple ring oscillator 200 of the prior art, comprising N delay stages 202.1 to 202.N connected in series, and an inverted feedback path from the last stage to the first stage. In operation, N different clock phases may be obtained from the outputs of each of the stages 202.1 to 202.N. It is usual to ensure that each of the N delay stages 202.1 to 202.N are identical thus yielding an evenly spaced distribution of phases. The frequency at which the simple ring oscillator 200 will oscillate is determined by the sum of the intrinsic delays of each delay stage. Ways to achieve a frequency change, thus turning the simple ring oscillator 200 into a VCO include changing the supply voltage or changing an internal bias voltage of each delay stage. It is appreciated that such a simple VCO may have many shortcomings, including a strong dependency on process variations, highly variable output voltage, and a tuning range that may be quite narrow.

The simple ring oscillator 200 may be analyzed as a loop of N amplifier stages. The input-output transfer function at DC of the chain of amplifiers is the same one that a single inverter has, a 180° phase shift. This means that the closed loop has a negative feedback. This stabilizes the DC operating point of each stage right in the center (in the case where all stages are identical) of their linear range of input-output characteristic. Assuming that all stages in the ring are identical makes analysis easier, and there are also other reasons why the stages should be identical and equally loaded, including the facility to derive evenly spaced clock phases from the circuit. It thus gives us a large voltage swing and equal phase shift from stage to stage, which is a must requirement in some applications.

The magnitude of the overall small signal gain of the chain of N amplifiers starts dropping with the slope of N×20 dB/decade after the frequency of the dominant pole (the 3 dB point) of the individual amplifier. As well, the phase shift increases significantly in the vicinity of the 3 dB point.

FIG. 3 illustrates exemplary simulation plots of the small signal gain and phase of a chain of four (N=4) amplifier stages, as a function of frequency, based on an open loop arrangement of the simple ring oscillator 200 of FIG. 2. The GAIN plot (upper part of FIG. 3) and the PHASE plot (lower part of FIG. 3) share the same frequency scale, logarithmic frequency ordinates covering the range of 1 MHz to 10 GHz. The vertical (abscissa) scales are from −40 to +30 dB (GAIN plot) and 0 to −500 degrees (PHASE plot). The low frequency gain of the chain of amplifier stages is about 26 dB, and the phase is 0 degrees.

At the frequency (about 1 GHz) where the total extra phase rotation reaches 180 degrees the negative feedback in the closed loop of the simple ring oscillator 200 (FIG. 2) becomes positive. At this frequency the magnitude of overall gain is about 15 dB, i.e. greater than one, and the loop will oscillate.

Triggered by the intrinsic noise, the voltage swing during the very first period (after power on) is like noise: small, on order of pVs. But after each time the wave passes the loop it is getting multiplied by the open loop gain. Such an avalanche continues until the voltage swing becomes larger than the linear range of the input/output characteristic and, as a result of nonlinearities, the gain will drop and becomes exactly equal to one, and stable oscillation continues. The mechanism described here, of gain settling to one is based on finite supply voltage and the limited linear range of input/output characteristics of the transistors. Disadvantages of this type of simple ring oscillator are nonlinear distortion of the generated signal and slowing down of the oscillating frequency, but a big advantage is its simplicity.

The nonlinear distortions pollute a spectrum of the oscillator's output signal by adding higher harmonics. The main reason why the oscillating frequency is reduced is that the gate capacitance of the amplifier transistors increases when the transistors go into triode mode.

Another effect that is caused by nonlinearities is a low frequency flicker noise up conversion. The noise contributors are the bias circuits of the amplifiers and the amplifier transistors themselves. Ideally, if the VCO circuit could work in the linear range, we should not see skirts surrounding oscillating frequency in a spectrum plot of the output signal.

It appears that the amount of up converted noise could be minimized by controlling the voltage swing of the signal that is circulating in the ring to such a level that it will stay within the linear range of the ring amplifiers. This will increase the maximum oscillating frequency as well. The phase noise may be improved by controlling the voltage swing, but no circuit optimization was attempted to investigate by how much the phase noise could be improved by controlling the voltage swing. A circuit of automatic gain control would be required to keep the voltage swing at a small enough level. This would make the circuit more complicated. And it is not clear what will diminish faster—the noise power or the carrier power when the voltage swing is reduced.

From FIG. 3 it follows that the oscillating frequency of the simple ring oscillator is proportional to the bandwidth of the chain of amplifier stages.

The bandwidth (often the delay term is used instead of bandwidth) is process dependent; it varies with the temperature and the supply voltage; it drifts when bias voltage/current settles after power up; and it drifts with aging.

As a result the oscillating frequency is changing or drifting continuously. In addition to that the oscillator's intrinsic noise impacts the oscillating frequency as well.

In many applications the VCO oscillating frequency must be changed to different values, for example to track a reference clock in a PLL.

In order to control the VCO oscillating frequency, to compensate for frequency drift and to suppress the phase noise, the VCO may have two kinds of tuning: a) coarse control and b) continuous tuning.

Coarse tuning may be used to switch between specified oscillating frequencies. It could be used to compensate for frequency shift due to permanent factors such as a process, for example. An automatic tracking loop may also be needed. It could be activated just once after power up and reset in order to choose the desired frequency range.

Coarse tuning is usually implemented by switching components of the ring amplifiers, components whose parameters have direct impact on the amplifier's bandwidth—for example differential stage tail current, load, etc.

It is more challenging to implement continual tuning, especially when the tuning range should be wide enough to compensate for the impact of all factors that may affect the oscillating frequency, including process variation.

Continual tuning of a simple ring oscillator (FIG. 2) may be implemented by adjusting the bandwidth of the ring amplifiers, but because of the tuning range limitation, other architectures have become more popular. These are generally based on a form of multiple-pass loop architecture, see examples in the following references:

Yalcin Alper Eken, Student Member, IEEE, and John P. Uyemura, Senior Member, IEEE, "A 5.9-GHz Voltage-Controlled Ring Oscillator in 0.18-um CMOS," in IEEE journal of solid-state circuits, vol. 39, no. 1, January 2004, pp. 230-233;

"Multiple interconnected ring oscillator circuit," U.S. Pat. No. 5,475,344 issued Dec. 12, 1995;

Edoardo Prete, Dirk Scheideler, Anthony Sanders, "A 100 mW 9.6 Gb/s Transceiver in 90 nm CMOS for next-generation memory interfaces," Infineon, Munich, Germany, ISSCC 2006/SESSION 4/GIGABIT TRANSCEIVERS/ 4.5;

D.-Y. Jeong, S.-H. Chai, W.-C. Song, and G.-H. Cho, "CMOS current-controlled oscillators using multiple-feedback loop architectures," in IEEE Int. Solid-State Circuits Conf. Dig. Tech. Papers, 1997, pp. 386-387;

L. Sun, T. Kwasniewski, and K. Iniewski, "A quadrature output voltage controlled ring oscillator based on three-stage subfeedback loops," in Proc. Int. Symp. Circuits and Systems, Conf. Dig. Tech. Papers, 1997, pp. 386-387.

These published concepts are fundamentally based on a multiple-pass loop architecture similar to the feed-forward architecture shown in FIG. 4.

FIG. 4 is a block diagram of a typical feed-forward ring oscillator 400 of the prior art, comprising N (N=4) amplifier stages 402.1 to 402.4. The amplifier stages may be implemented with differential inputs and outputs, but for reasons of simplicity, single-ended circuits and signals are described. Each of the amplifier stages 402.1 to 402.4 includes three inputs, a primary input "P", a secondary input "S" and a tuning input "T". Each of the amplifier stages 402.1 to 402.4 further includes a non-inverting output 404, i.e. non-inverting outputs 404.1 to 404.4. The last amplifier stage 402.4 further includes an inverting output 406.4. When the amplifier stages 402.1 to 402.4 are implemented as differential circuits, at least the primary and secondary inputs "P" and "S" are differential, and each amplifier includes a differential output having both non-inverting and inverting terminals (404.$i$ and 406.$i$, $i$=1 to 4). The tuning input "T" may be a single ended input, even when the remaining circuitry is differential. The tuning inputs "T" of all amplifier stages 402.1 to 402.4 may be connected to a common tuning voltage 408. The tuning voltage 408 may, for example, be generated by a loop filter (see the PLL 100 in FIG. 1, including the loop filter 108 and the VCO 112 which could be an instance of the feed-forward ring oscillator 400).

The primary connections of the feed-forward ring oscillator 400 are similar to connections of the simple ring oscillator 200 of FIG. 2, that is, the non-inverting output of each of the first N−1 amplifier stages 402.$i$ is connected to the primary input of the next amplifier stage 402.$i$+1 and the inverting output 406.N of the Nth amplifier stage 404.N is connected to the primary input "P" of the first amplifier stage 402.1.

Thus, in the present example where N=4, the following are the primary connections:

the output 404.1 is connected to the input "P" of the amplifier stage 402.2;

the output 404.2 is connected to the input "P" of the amplifier stage 402.3;

the output 404.3 is connected to the input "P" of the amplifier stage 402.4;

and the inverting output 406.4 is connected to the input "P" of the amplifier stage 402.1.

In a set of secondary connections the input "P" of each amplifier stage 402.i is connected to the secondary input "S" of the next amplifier stage in the ring.

Thus, in the present example where N=4, the following are the secondary connections:

the output 404.1 is connected to the input "S" of the amplifier stage 402.3;
the output 404.2 is connected to the input "S" of the amplifier stage 402.4;
the output 404.3 is connected to the input "S" of the amplifier stage 402.1;

and the inverting output 406.4 is connected to the input "S" of the amplifier stage 402.2.

The secondary connections add auxiliary feed forward loops that work in conjunction with the primary loop of the basic (simple) ring oscillator topology. Within each amplifier stage adjustable portions of the signals arriving at the primary and secondary inputs "P" and "S" are amplified. The adjustment of the portions is controlled by the magnitude of the tuning voltage 408 that is fed to the "T" input of each amplifier stage. The purpose is to reduce the phase shift (i.e. the delay) of each amplifier in the ring, which results in an increase of the oscillating frequency as a higher proportion of the secondary signal is propagated.

Frequency tuning of the feed-forward ring oscillator 400 is thus achieved by adjusting the mix of the secondary inputs with the primary inputs in each amplifier stage 402. When the strength of the secondary inputs is set to zero, the feed-forward ring oscillator 400 behaves in a manner that is equivalent to the simple ring oscillator 200. By increasing the strength of the secondary inputs, the oscillating frequency is increased which has two disadvantages, the tuning range is limited by the high frequency characteristics of the circuitry, and the signal swing of the outputs decreases with the increasing tuning frequency.

In a VCO built on the principle of the feed-forward ring oscillator 400, the tuning range is limited and the VCO output signal swing decreasing when the tuned frequency is increased. This is illustrated in the following simulation plots.

FIG. 5 shows a simulation plot of three output signal waveforms ($F_{low}$, $F_{medium}$, and $F_{high}$) at an output (any of 404.1 to 404.4) of the feed-forward ring oscillator 400 (FIG. 4), when the tuning voltage 408 is set to one of three different values to achieve a high, medium and low oscillating frequency. The scale of the ordinate is time in nanoseconds (nS) ranging from 15.0 to 17.0 nS suited to displaying a number of cycles at the frequencies of interest. The scale of the abscissa is voltage in Volts (V), ranging from 0.5 to 1.0 V. The plot in FIG. 5 shows waveforms at the positive output of a differential stage, thus of a single ended signal; the value of each corresponding differential output voltage swing is twice that of the single ended signal. The three output signal waveforms are sinusoids, oscillating with different frequencies and voltage swings:

The frequency of the output signal waveform $F_{low}$ is approximately 5.8 GHz and its differential voltage swing between low and high peaks is approximately 0.807 V. The frequency of the output signal waveform $F_{medium}$ is approximately 7.24 GHz and its differential voltage swing is approximately 0.536 V. The frequency of the output signal waveform $F_{high}$ is approximately 9.2 GHz and its differential voltage swing is approximately 0.247 V.

FIG. 6 shows simulation plots of the differential voltage swing and the oscillating frequency of the feed-forward ring oscillator 400 (FIG. 4) when the tuning voltage is varied between about −0.2 and +0.2 Volt. The upper graph ("Differential Voltage Swing") has a vertical voltage scale ranging from 0.2 V to 0.8 V while the lower graph ("Frequency") has a vertical frequency scale ranging from 5.0 GHz to 10.0 GHz.

As the "Differential Voltage Swing" graph shows, the differential voltage swing varies from about 0.8 V to about 0.25 V as the tuning voltage is increased over the tuning range from −0.2 V to about 0.15 V. Over the same tuning range, the "Frequency" graph shows the oscillating frequency to increase from about 5.9 GHz to about 9.2 GHz. When the tuning voltage is increased beyond about the upper limit of the tuning range at about 0.15 V, the oscillation stops because at that point the open loop gain of the exemplary feed-forward ring oscillator becomes less than zero.

The foregoing analysis shows that the tuning range covers less than an octave in frequency, and the corresponding voltage swing varies by a large amount. These properties of the feed-forward ring oscillator 400 make this type of oscillator unsuitable as a VCO in a system which requires a much wider tuning range. The drop in voltage swing also makes the oscillating signal difficult to use directly, without additional amplification stages which will add to the cost and contribute additional jitter.

SUMMARY OF THE INVENTION

Therefore it is an object of the present invention to provide an improved voltage controlled oscillator with a wide tuning range and substantially constant voltage swing over the tuning range, which would obviate or mitigate shortcomings of the prior art.

According to one aspect of the invention there is provided a voltage controlled oscillator (VCO) including a plurality N of amplifier stages, each amplifier stage comprising an output, a primary input, and a feedback input, and at least one of the amplifier stages including a tuning input, wherein:

each output is connected to the primary input of a different stage so as to form a ring of stages;
the feedback input of each stage is connected to the output of a subsequent stage in the ring; and
the tuning inputs are connected to a control voltage for controlling the oscillating frequency of the ring.

In the VCO described above, the output of at least one of the amplifier stages is an inverting output. The VCO of the embodiment of the invention has N=4 amplifier stages, and the subsequent stage is a stage immediately following the each amplifier stage. In the embodiment of the invention, each amplifier stage has a tuning input.

At least one of the amplifier stages comprises:
a primary amplifier terminating the primary input;
a secondary amplifier terminating the feedback input;
a common amplifier load providing a combined load for the primary and the secondary amplifiers to form the output of the stage; and
a tuning circuit for converting the tuning input into tuning factors for controlling gains of the primary and secondary amplifiers.

The subsequent stage is chosen so as to deliver a phase signal having a phase delay relative to the primary input, to the feedback input of the each stage, e.g., the phase delay, which is less or equal 90°.

According to another aspect of the invention, there is provided a method of generating a variable frequency in a ring oscillator having N amplifier stages, the method comprising:

inputting an output of each stage to a primary input of the next stage in the ring;
inputting an output of a subsequent stage to a secondary input of the each stage so as to provide a feedback having a phase delay relative to the primary input;

amplifying the primary input by a variable primary gain;
amplifying the secondary input by a variable secondary gain; and
controlling the variable primary and secondary gains with a control voltage.

Conveniently, the phase delay is less or equal 90°. In the method of the embodiment of the invention, the ring oscillator has N=4 amplifier stages.

According to yet another aspect of the invention, there is provided a phase lock loop (PLL) including a voltage controlled oscillator (VCO), the VCO including a plurality N of amplifier stages, each amplifier stage comprising an output, a primary input, and a feedback input, and at least one of the amplifier stages including a tuning input, wherein:

each output is connected to the primary input of a different stage so as to form a ring of stages;
the feedback input of each stage is connected to the output of a subsequent stage in the ring; and
the tuning inputs are connected to a control voltage for controlling the oscillating frequency of the ring.

Conveniently, the output of at least one of the stages of the VCO is an inverting output. In the embodiment of the invention the plurality of amplifier stages N=4. In the PLL described above, the subsequent stage is the amplifier stage immediately following the each amplifier stage in the ring. Beneficially, each amplifier stage has a tuning input, and at least one amplifier stage comprises:

a primary amplifier terminating the primary input;
a secondary amplifier terminating the feedback input;
a common amplifier load providing a combined load for the primary and the secondary amplifiers to form the output of the stage; and
a tuning circuit for converting the tuning input into tuning factors for controlling gains of the primary and secondary amplifiers.

Preferably, in the PLL described above, the subsequent stage is chosen so as to deliver to the feedback input of the each stage a phase delayed signal having a phase delay relative to the primary input. Preferably, the phase delay is less or equal 90°.

Thus, an improved VCO, PLL employing the VCO, and a method for generating a variable frequency in a ring oscillator have been provided.

BRIEF DESCRIPTION OF THE DRAWINGS

An embodiment of the invention will now be described, by way of example, with reference to the accompanying drawings in which.

DETAILED DESCRIPTION OF THE EMBODIMENTS OF THE INVENTION

In order to overcome the disadvantages of the feed-forward ring oscillator, a new topology is proposed which provides a VCO with a much wider tuning range while maintaining a substantially constant voltage swing. Unlike the feed-forward ring oscillator of the prior art which is characterized by feed-forward connections that bypass oscillator stages, the Feedback multipass Ring Oscillator of the invention is characterized by feed-backward connections that feed the output of a stage to an input of an earlier stage. It has been discovered that this novel topology overcomes the above mentioned limitations of the prior-art "feed-forward" ring oscillator. The Feedback multipass Ring Oscillator of the invention provides decreasing frequency when tuned, thus allowing it to cover a much wider tuning range. At the same time it also provides almost constant amplitude over the entire tuning range.

Figure 7:
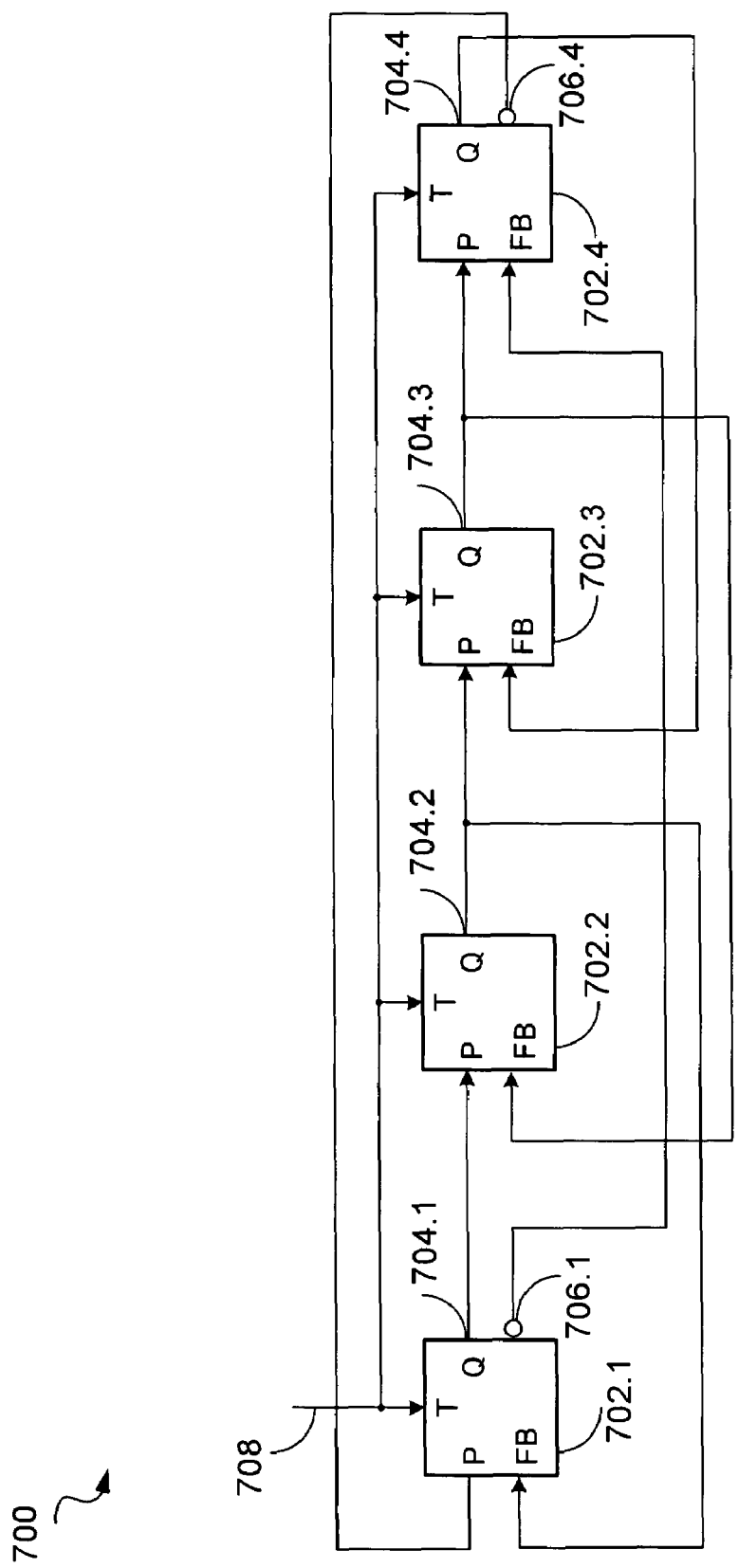
FIG. 7 is a block diagram of a Feedback multipass Ring Oscillator 700 which is an exemplary embodiment of the present invention.

FIG. 7 is a block diagram of a Feedback multipass Ring Oscillator 700 which is an exemplary embodiment of the present invention. The Feedback multipass Ring Oscillator 700 comprises N (N=4) amplifier stages 702.1 to 702.4. The amplifier stages may be implemented with differential inputs and outputs, but for reasons of simplicity, single-ended circuits and signals are described first. Each of the amplifier stages 702.1 to 702.4 includes three inputs, a primary input "P", a feedback input "FB" and a tuning input "T". Each of the amplifier stages 702.1 to 702.4 further includes a non-inverting output 704, i.e. non-inverting outputs 704.1 to 704.4. The last amplifier stage 702.4 further includes an inverting output 706.4. The amplifier stages 702.1 to 702.4 may also be implemented as differential circuits, in which case at least the primary and secondary inputs "P" and "FB" are differential, and each amplifier includes both non-inverting and inverting outputs (704.*i* and 706.*i*, i=1 to 4). The tuning input "T" may be a single ended input, even when the remaining circuitry is differential. The tuning inputs "T" of all amplifier stages 702.1 to 702.4 may be connected to a common tuning voltage 708.

Figure 2:
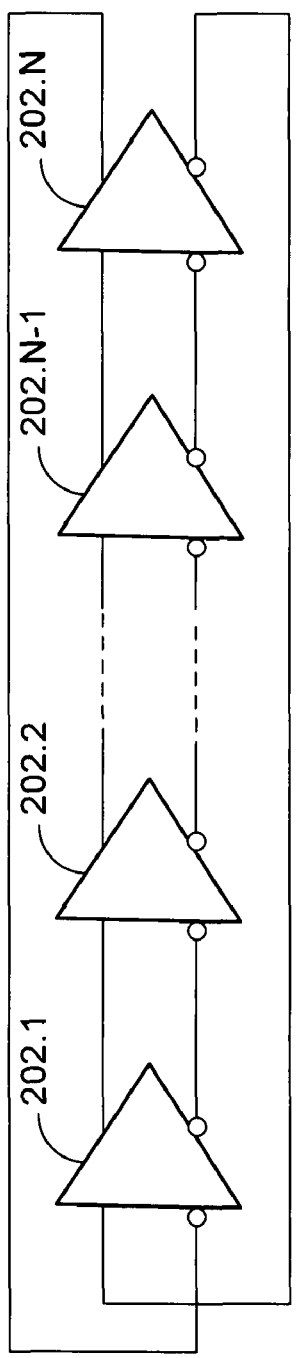
FIG. 2 is a block diagram of a simple ring oscillator 200 of the prior art.
Figure 3:
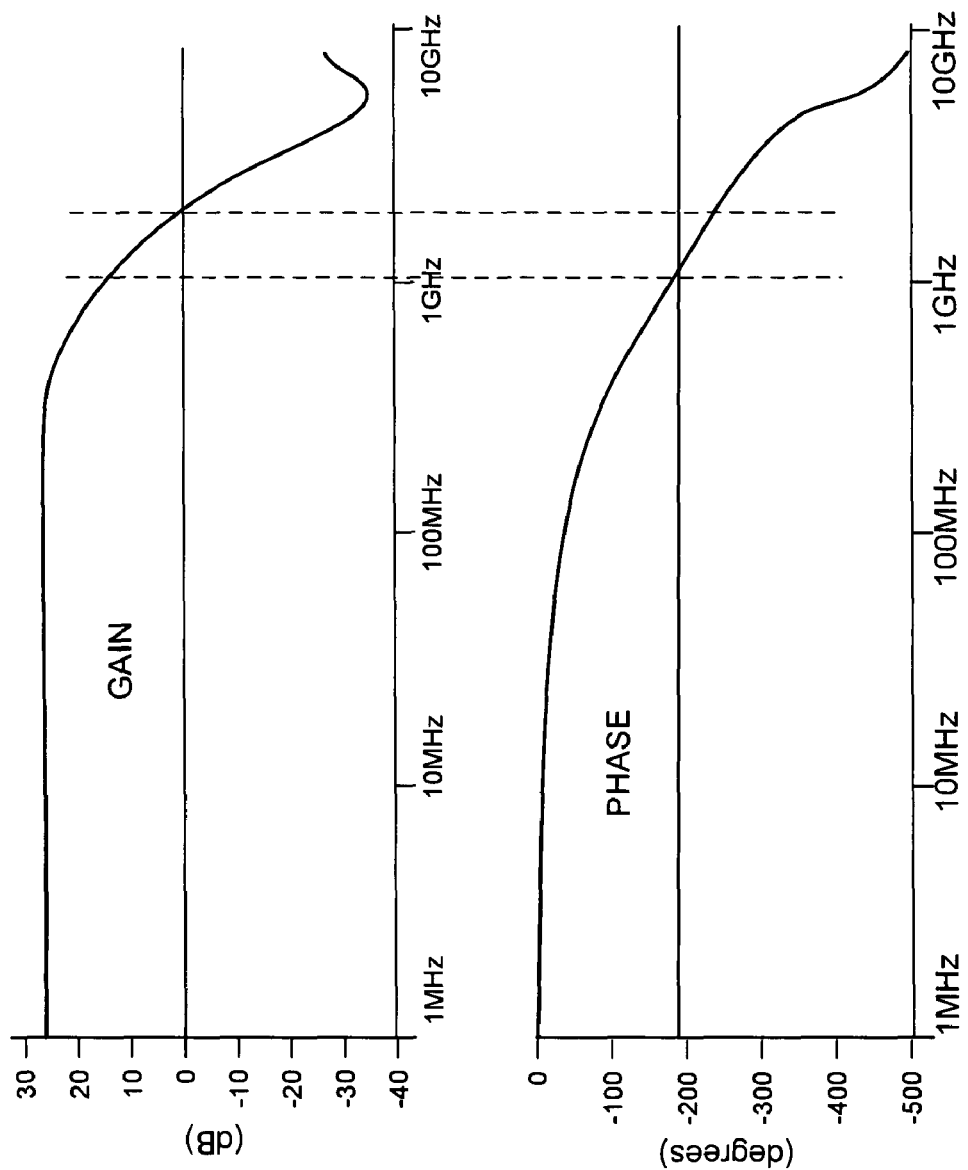
FIG. 3 illustrates exemplary simulation plots of the small signal gain and phase of a chain of four (N=4) amplifier stages, as a function of frequency, based on an open loop arrangement of the simple ring oscillator 200 of FIG. 2.

The primary connections of the Feedback multipass Ring Oscillator 700 are similar to connections of the simple ring oscillator 200 of FIG. 2, that is, the non-inverting output of each of the first N−1 amplifier stages 702.*i* is connected to the primary input of the subsequent amplifier stage 702.*i*+1 and the inverting output 706.N of the Nth amplifier stage 704.N is connected to the primary input "P" of the first amplifier stage 702.1.

Thus, in the present example where N=4, the following are the primary connections:

the output 704.1 is connected to the input "P" of the amplifier stage 702.2;

the output 704.2 is connected to the input "P" of the amplifier stage 702.3;

the output 704.3 is connected to the input "P" of the amplifier stage 702.4;

and the inverting output 706.4 is connected to the input "P" of the first amplifier stage 702.1.

In a set of feedback connections the output of each amplifier stage 702.i is fed back to the "FB" input of the previous stage in the ring.

Thus, in the present example where N=4, the following are the feedback connections:

the output 704.2 is connected to the input "FB" of the amplifier stage 702.1;

the output 704.3 is connected to the input "FB" of the amplifier stage 702.2;

the output 704.4 is connected to the input "FB" of the amplifier stage 702.3;

and the inverting output 706.1 is connected to the input "FB" of the last amplifier stage 702.4.

Frequency tuning of the Feedback multipass Ring Oscillator 700 is achieved by adjusting the mix of the feedback inputs with the primary inputs in each amplifier stage 702. When the strength of the feedback inputs is set to zero, the Feedback multipass Ring Oscillator 700 behaves in a manner that is equivalent to the simple ring oscillator 200. By increasing the strength of the feedback inputs, the oscillating frequency is decreased unlike the feed-forward ring oscillator 400 of the prior art in which the oscillating frequency is increased when the strength of the secondary inputs is increased. Decreasing instead of increasing the oscillating frequency has two advantages: the tuning range is not limited by the high frequency characteristics of the circuitry since the frequency can be decreased by tuning to a very low frequency, and the signal swing of the outputs remains virtually constant with the decreasing frequency, as will be demonstrated in FIGS. 10 and 11 below.

Figure 8:
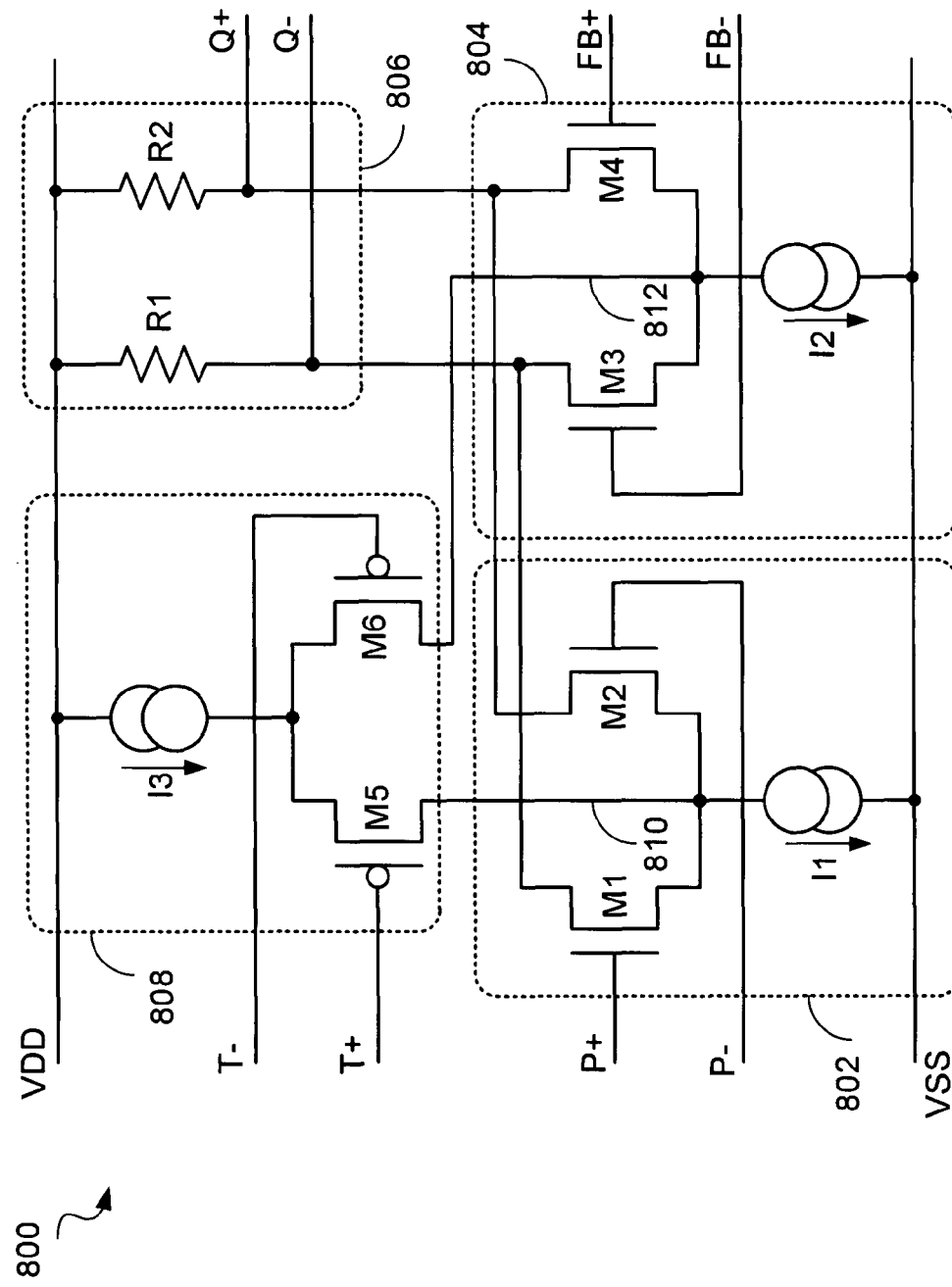
FIG. 8 shows a simplified circuit diagram of a differential tunable amplifier circuit 800 which is an exemplary implementation of the amplifier stage 702.1 of FIG. 7.

FIG. 8 shows a simplified circuit diagram of a differential tunable amplifier circuit 800 which is an exemplary implementation of any of the amplifier stages 702 of FIG. 7. The differential tunable amplifier circuit 800 comprises four sections: a primary amplifier section 802; a secondary amplifier section 804; a common amplifier load section 806; and a tuning circuit section 808.

The differential tunable amplifier circuit 800 is connected to the positive and negative power supply rail VDD and VSS respectively. The inputs P, FB, and T, and the output Q of the amplifier stage 702 are represented in the differential tunable amplifier circuit 800 by correspondingly named differential signal nodes P+ and P− as inputs of the primary amplifier section 802, FB+ and FB− as inputs of the secondary amplifier section 804, T+ and T− as inputs of the tuning circuit section 808, and Q+ and Q− as shared outputs of the primary amplifier section 802 and the secondary amplifier section 804, and connected to the common amplifier load section 806.

The primary amplifier section 802 includes two N-MOS (negative metal-oxide semiconductor) transistors M1 and M2, and a current source I1. The gates of the N-MOS transistors M1 and M2 are connected to the signal nodes P+ and P− respectively; the drains of the N-MOS transistors M1 and M2 are connected to the shared output nodes Q+ and Q−; and the sources of the N-MOS transistors M1 and M2 are joined together at a primary tuning control node 810 which is also connected to the negative power supply rail VSS via the current source I1.

Similarly, the secondary amplifier section 804 includes two N-MOS transistors M3 and M4, and a current source I2. The gates of the N-MOS transistors M3 and M4 are connected to the signal nodes FB+ and FB− respectively; the drains of the N-MOS transistors M3 and M4 are connected to the shared output nodes Q+ and Q−; and the sources of the N-MOS transistors M3 and M4 are joined together at a secondary tuning control node 812 which is also connected to the negative power supply rail VSS via the current source I2.

The common amplifier load section 806 includes two load resistors R1 and R2 which are respectively connected between the shared output nodes Q+ and Q−, and the positive power supply rail VDD.

The tuning circuit section 808 includes two P-MOS (positive metal-oxide semiconductor) transistors M5 and M6 whose sources are tied together and connected to the positive power supply rail VDD through a current source I3. The gates of the P-MOS transistors M5 and M6 are connected to the signal nodes T+ and T− respectively, and their drains are connected to the primary and the secondary tuning control nodes 810 and 812 respectively.

In operation, the primary and secondary amplifier sections 802 and 804 amplify their input signals (P and FB) to generate a delayed common output signal (Q) which is the sum of the amplified primary and secondary input signals. The gain of each of the primary and secondary amplifier sections 802 and 804 is dependent on the amount of current flowing in the N-MOS transistors M1, M2 and M3, M4 of each amplifier section. These currents are initially defined by the current sources I1 and I2 in the two amplifier sections, but may be modified by currents drained away by the tuning circuit section 808 through the primary and the secondary tuning control nodes 810 and 812. The current flowing through the tuning circuit section 808 is given by the current source I3, and is divided among the tuning control nodes 810 and 812 according to the (differential) voltage of the tuning input T.

In the preferred implementation of the embodiment of the invention, the currents flowing through the current sources I2 and I3 are approximately equal, By suitably driving the tuning inputs T+ and T−, all of the current from I3 may be steered through the P-MOS transistor M6 of the tuning circuit section 808 into the secondary tuning control node 812, leaving no current to flow through the N-MOS transistors M3, M4 of the secondary amplifier section 804 without current and effectively setting the contribution (strength) of the feedback signal at FB to zero.

The contribution of the feedback signal may be increased by splitting the current I3 so that less current flows into the secondary tuning control node 812 while at the time "stealing" some of the current I1 through the primary tuning control node 810 which results in reducing the strength of the primary input P. It is thus evident that any mix of primary and feedback signal may be chosen. The sum of the currents flowing through the four N-MOS transistors M1 to M4 is constant as determined by the current source I1, hence the combined gain of the two primary and secondary amplifier sections 802 and 804 remains constant, and the amplified output signal Q is a tunable mix of the primary and the feedback inputs.

Figure 9:
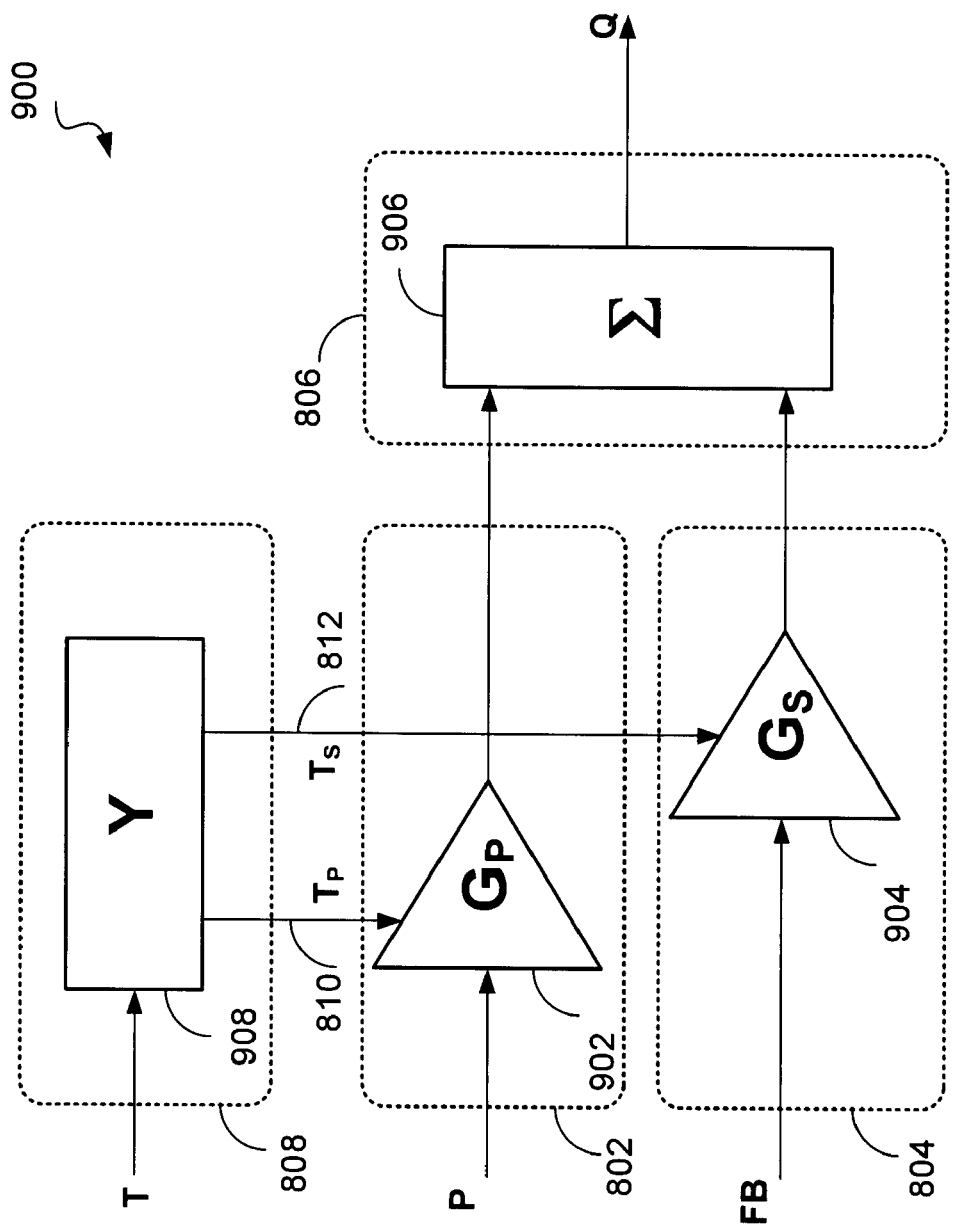
FIG. 9 shows a block diagram of a tunable amplifier function 900 corresponding to a functional representation of the differential tunable amplifier circuit 800 of FIG. 8.

The functionality of the tunable amplifier circuit 800 is further symbolically illustrated in FIG. 9.

FIG. 9 shows a block diagram of a tunable amplifier function 900 corresponding to a functional representation of the differential tunable amplifier circuit 800, sections of the tunable amplifier function 900 being labeled with the same reference numerals as the corresponding sections of the tunable amplifier circuit 800 of FIG. 8.

The functional representation of the primary amplifier section 802 includes a primary controllable gain function 902 ("$G_P$").

Similarly, the functional representation of the secondary amplifier section 804 includes a secondary controllable gain function 904 ("$G_S$").

The common amplifier load section 806 is represented by a summing function 906 ("$\Sigma$"), coupled to the outputs of the controllable gain functions 902 and 904. The tuning circuit section 808 is functionally represented by a tuning function 908 ("Y") which splits the tuning input "T" into primary and the secondary tuning factors ("$T_P$" and "$T_S$"), corresponding to the primary and the secondary tuning control nodes 810 and 812 (FIG. 8) respectively.

The output of the tunable amplifier function 900 is the output "Q" of the summing function 910.

As described earlier, the complete Feedback multipass Ring Oscillator 700 (FIG. 7) is comprised of a ring of tunable amplifier circuits 800 (FIG. 8) each of which in turn may be functionally represented by the tunable amplifier function 900.

The two input signals ("P" and "FB") of each tunable amplifier circuit 800 are coupled to the amplifier sections 802 and 804 (the controllable gain functions 902 "$G_P$" and 904 and "$G_S$") respectively whose outputs are summed in the common amplifier load section 806 (the summing function 906 "$\Sigma$"). The actual gains "$G_P$" and "$G_S$" are under the control of the tuning factors "$T_P$" and "$T_S$". The gains of the amplifier sections 802 and 804 are determined by the currents flowing through the amplifying transistors M1 and M2, and M3 and M4 respectively, determined by the current sources I1, I2, and I3 (see FIG. 8). As determined by the tuning voltage at the input "T" (i.e. the differential voltage between "T+" and "T−"), the current of the current source I3 is split into two currents, I3' into the primary tuning control node 810 and I3" into the secondary tuning control node 812. As a result, the (constant) current I1 does not necessarily flow only through the transistor M1 and M2, for example, but some of the current I1 is diverted into the current I3', thus reducing the gain of the primary amplifier section 802. Similarly, the gain of the secondary amplifier section 804 is defined by the difference between the current I2 and the current I3". But the sum of I3' and I3" is constant, i.e. I3.

The overall effect of increasing the tuning voltage T is to increase I3' which results in decreasing the primary gain "$G_P$" (the gain of the primary amplifier section 802) while increasing the secondary gain "$G_S$" (the gain of the secondary amplifier section 804).

In the preferred implementation (FIG. 8), the currents defined by the current sources I2 and I3 are equal, and set relative to the current I1 such that a maximum gain "$G_{Smax}$" of the secondary amplifier section 804 is approximately ½ of a maximum gain "$G_{Pmax}$" of the primary amplifier section 802.

The secondary gain "$G_S$" (the gain of the secondary amplifier section 804) may thus be varied in the range of $$0 \leq G_S < G_{Smax}.$$

The maximum value of $G_S$ (i.e. $G_{Smax}$) may be further limited to be proportional to the required tuning range.

The primary gain "$G_P$" (the gain of the primary amplifier section 802) may then vary in the range of $$G_{Pmax} \geq G_P > (G_{Pmax} - G_S).$$

$G_P$ is thus reducing when $G_S$ increases, but the sum of main and secondary gains remains approximately equal to $G_{Pmax}$.

Figure 4:
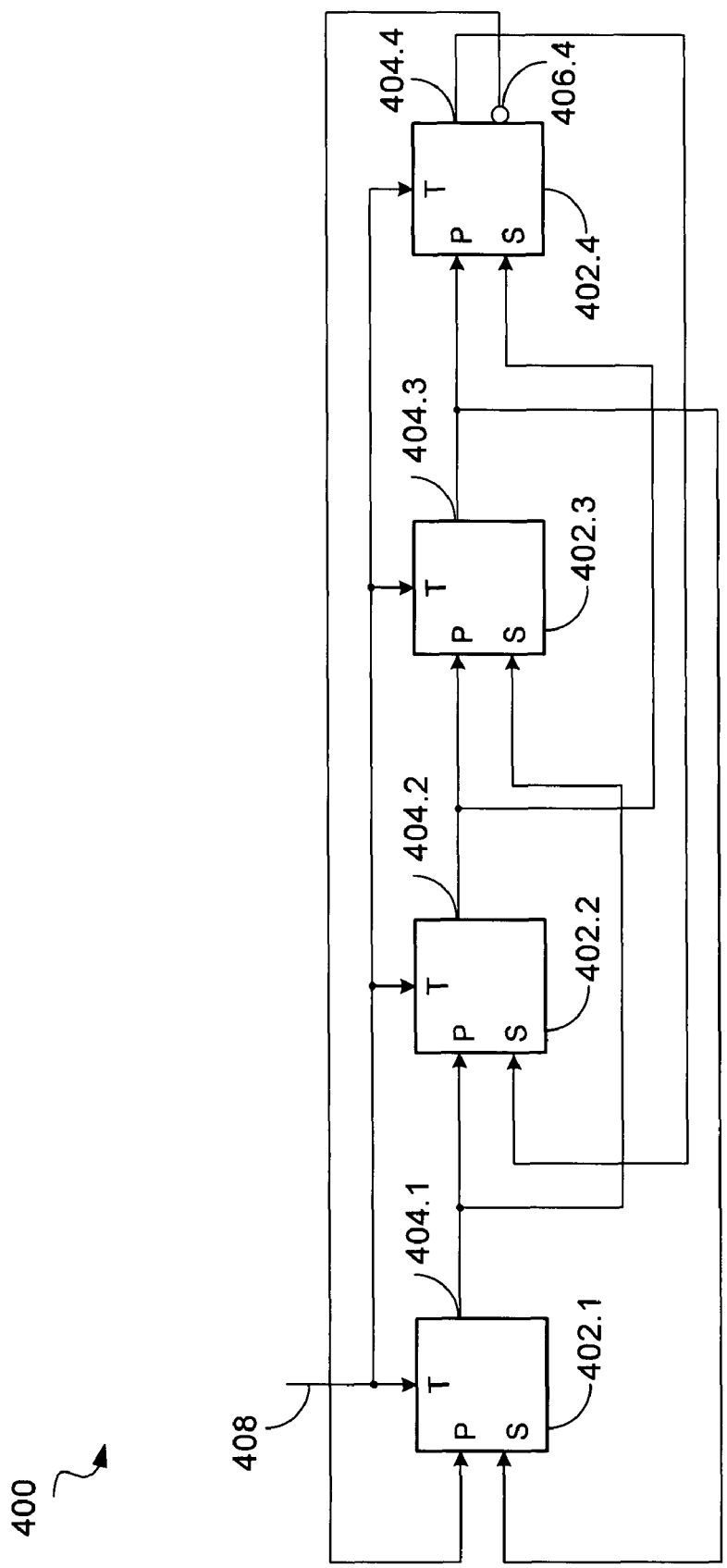
FIG. 4 is a block diagram of a typical and exemplary feed-forward ring oscillator 400 of the prior art.

While the overall topology of the Feedback multipass Ring Oscillator 700 (FIG. 7) of the invention may at first glance resemble the topology of the feed-forward ring oscillator 400 of the prior art (FIG. 4), there is a significant difference in the behavior of the two different arrangements when the tuning voltage is increased. The feed-forward connections of the prior art serve to increase the oscillating frequency and decrease the voltage swing; by contrast, the feedback connections of the present invention (FIG. 7) serve to decrease the oscillating frequency without a significant change in voltage swing. Furthermore, the decrease in frequency with tuning (of the circuit of the invention) does not have the side-effect of reducing the overall gain of the amplifier stage. These advantages are obtained by correctly choosing for each amplifier stage 702.i (FIG. 7) the feedback input "FB", to be phase shifted and delayed by 90° with respect to the primary input "P", as shown in FIG. 7 for N=4, as the preferred embodiment.

In general, the phase shift between the stages of an N-stage ring oscillator is $\phi=180°/N$ defining the available phases. If the choice of N does not allow phase differences of 90° to be obtained then the closest value to, and less than, 90° should be selected.

Compared to the prior art (FIG. 4) that teaches a frequency increasing architecture in which the amplifier bandwidth before tuning is derived from the lowest frequency of the tuning range, the frequency decreasing architecture of the Feedback multipass Ring Oscillator 700 (FIG. 7) of the invention has as a condition for the amplifier bandwidth that the oscillating frequency, when the secondary amplifier section is disabled, must be the highest frequency within the tuning range.

Figure 10:
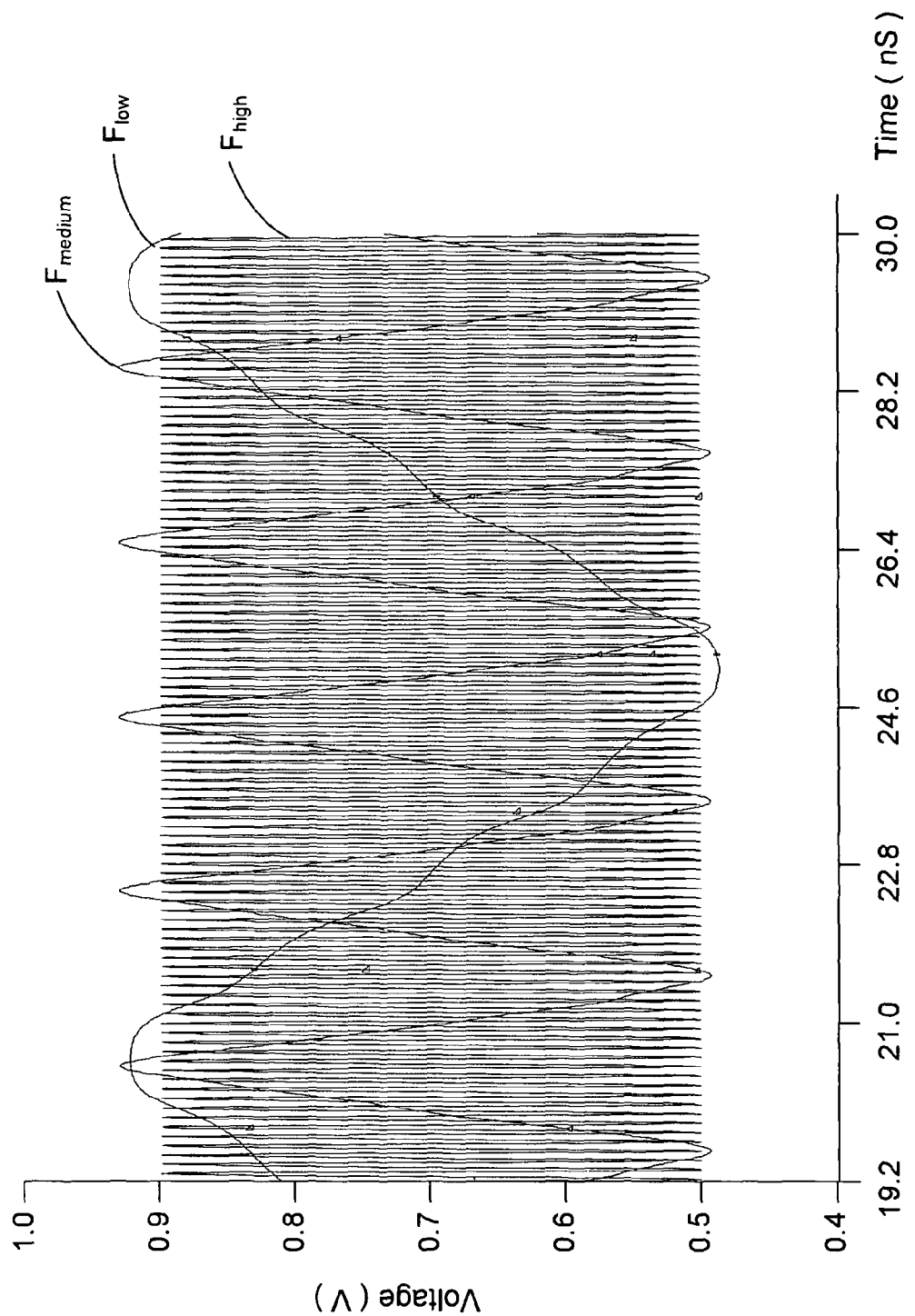
FIG. 10 shows a simulation plot of three output signal waveforms at an output of the Feedback multipass Ring Oscillator 700 of FIG. 7.

FIG. 10 shows an exemplary simulation plot of three output signal waveforms ($F_{low}$, $F_{medium}$, and $F_{high}$) at an output (any of 707.1 to 704.4) of the Feedback multipass Ring Oscillator 700 (FIG. 7), when the tuning voltage 708 is set to one of three different values to achieve a high, medium and low oscillating frequency. The scale of the ordinate is time in nanoseconds (nS) ranging from 19.2 to 30.0 nS suited to displaying a number of cycles at the frequencies of interest. The scale of the abscissa is voltage in Volts (V), ranging from 0.4 to 1.0 V. The plot in FIG. 10 shows waveforms at the positive output of a differential stage, thus of a single ended signal; the value of each corresponding differential output voltage swing is twice that of the single ended signal. The three output signal waveforms are sinusoids, oscillating with different frequencies and voltage swings:

The frequency of the output signal waveform $F_{low}$ is approximately 0.114 GHz and its single ended voltage swing between low and high peaks is approximately 0.43 V;

The frequency of the output signal waveform $F_{medium}$ is approximately 0.51 GHz and its single ended voltage swing is approximately 0.43 V; and The frequency of the output signal waveform $F_{high}$ is approximately 9.35 GHz and its single ended voltage swing is approximately 0.40 V.

Figure 5:
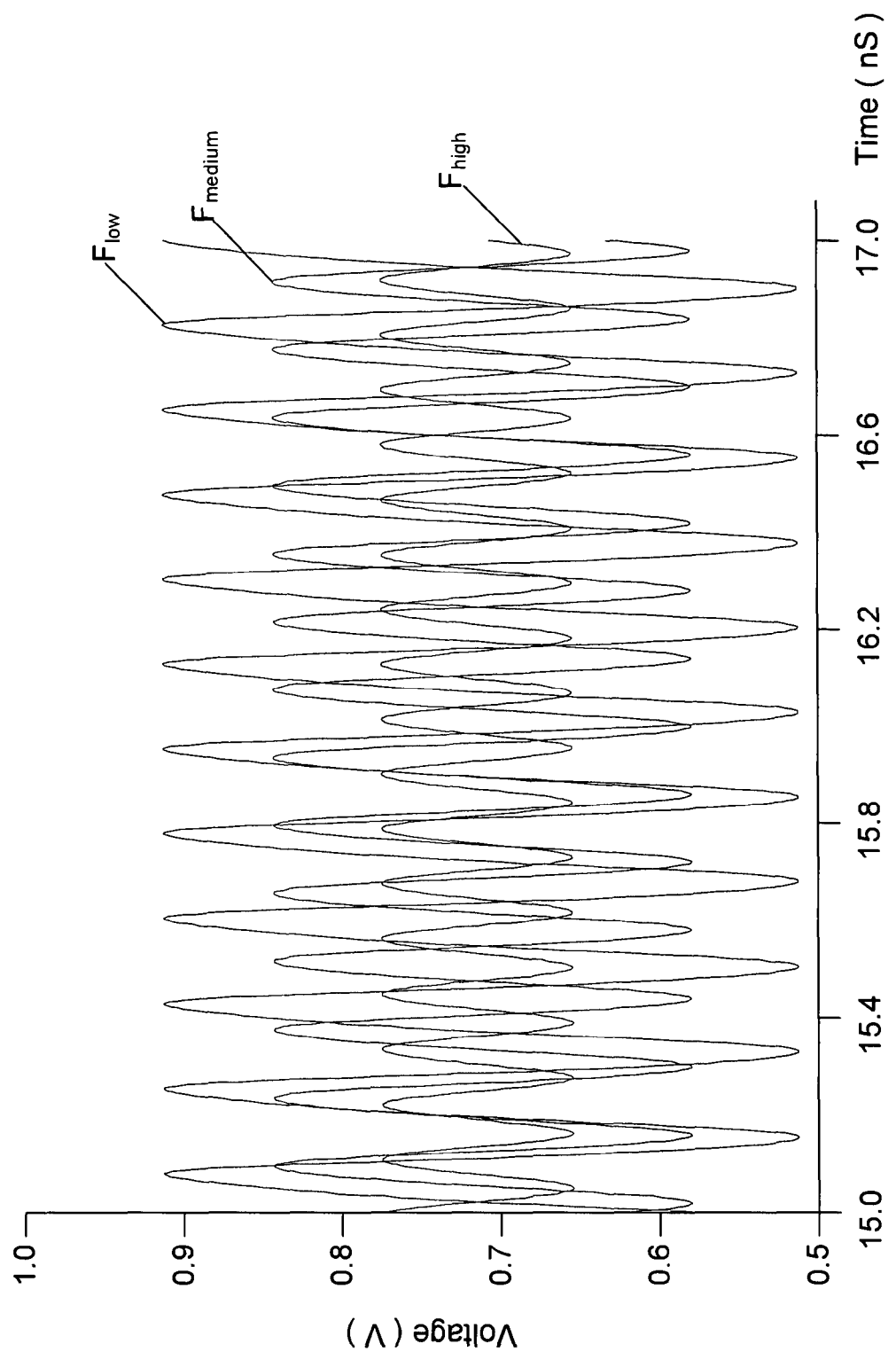
FIG. 5 shows a simulation plot of three output signal waveforms of the feed-forward ring oscillator 400 of FIG. 4.
Figure 6:
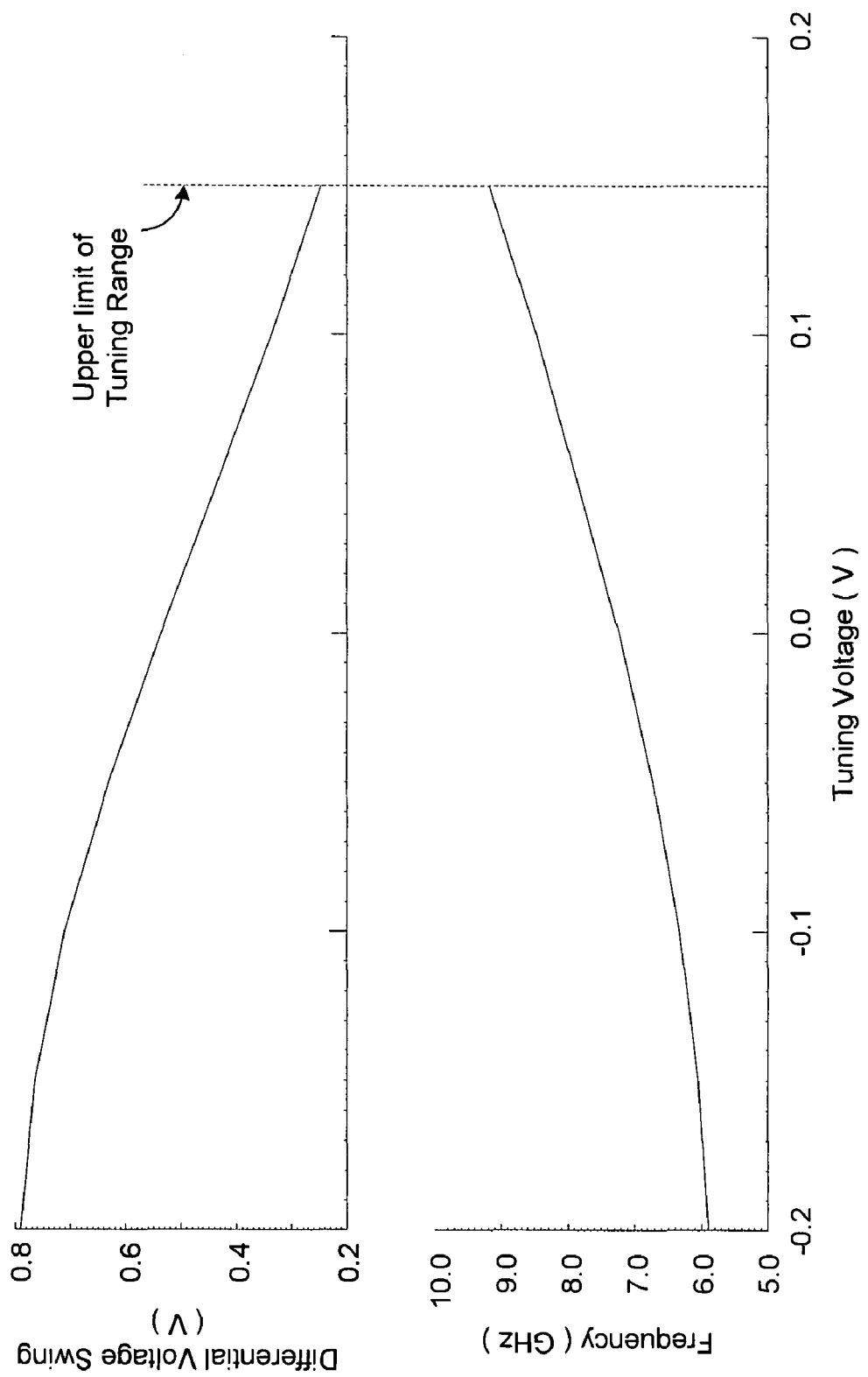
FIG. 6 shows simulation plots of the oscillator voltage swing and the oscillating frequency of the feed-forward ring oscillator 400 (FIG. 4)

Compared to the results shown in FIG. 5 that were obtained with a simulation of the prior art circuit (FIG. 4), the simulation of the innovative circuit of the invention (FIG. 7) shows a much wider tuning range (0.114 GHz to 9.35 GHz, a ratio of 82) and an almost constant amplitude.

Figure 11:
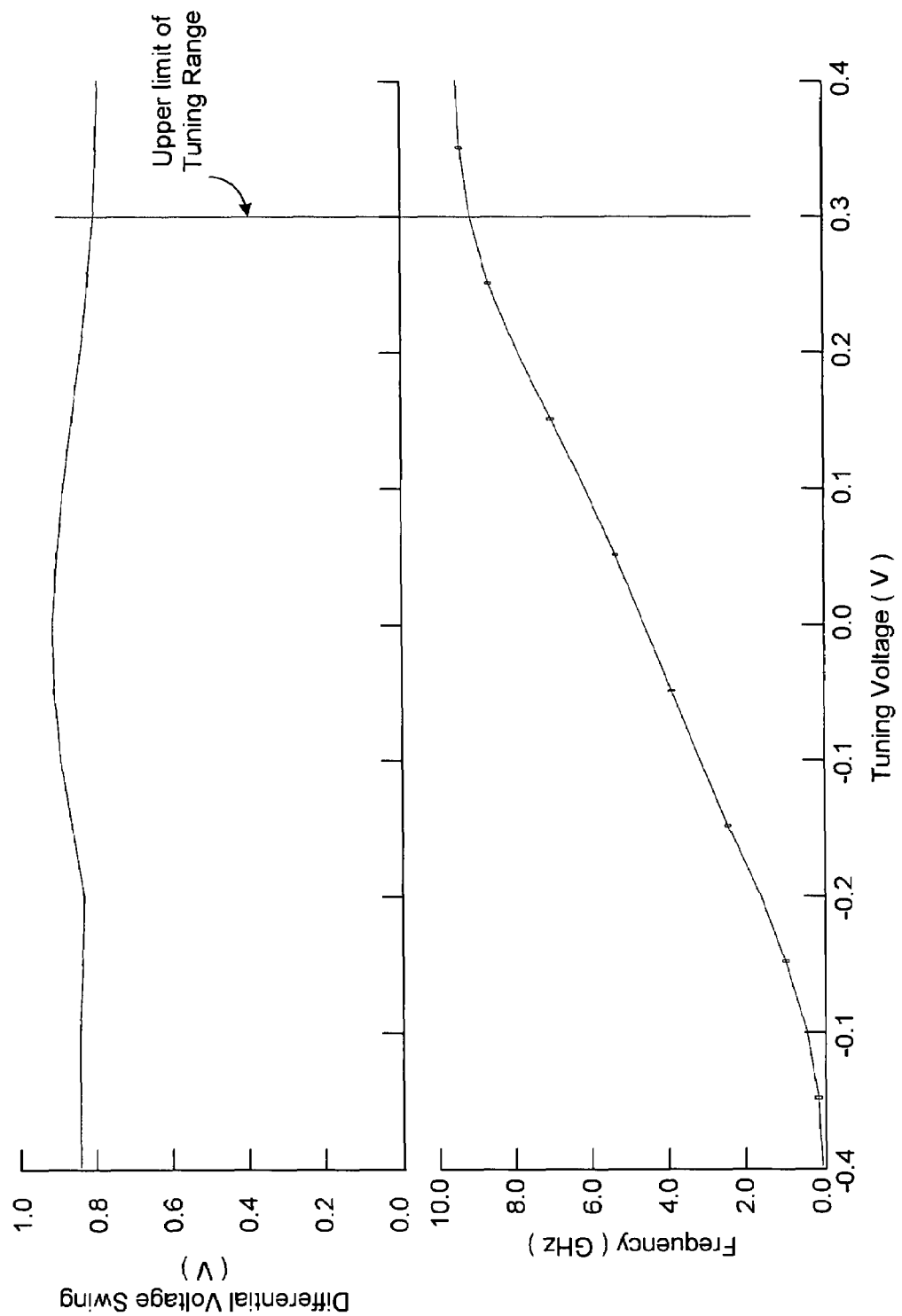
FIG. 11 shows simulation plots of the oscillator voltage swing and the oscillating frequency of the Feedback multipass Ring Oscillator 700 of FIG. 7.

FIG. 11 shows simulation plots of the differential voltage swing (upper graph) and the oscillating frequency (lower graph) of the Feedback multipass Ring Oscillator 700 (FIG. 7) when the tuning voltage is varied between about −0.4 and +0.3 Volt. The upper graph ("Differential Voltage Swing") has a vertical voltage scale ranging from 0 to 1.0 V while the lower graph ("Frequency") has a vertical frequency scale ranging from 0 to 10.0 GHz.

As the "Differential Voltage Swing" graph shows, the differential voltage swing remains fairly constant at or above about 0.8 V as the tuning voltage is increased over the tuning range from −0.4 V to about 0.3 V. Over the same tuning range, the "Frequency" graph shows the oscillating frequency to increase from almost 0 GHz to over 9.0 GHz. When the tuning voltage is increased beyond about the upper limit of the tuning range at about 0.3 V, the oscillation continues but the frequency increases only slightly because the high speed limit of the technology is approached.

The tuning voltage for controlling the oscillating frequency of the Feedback multipass Ring Oscillator 700 (cf. 708, FIG. 7 and "T" FIGS. 8 and 9) may, for example, be generated by a loop filter in a PLL design.

Figure 12:
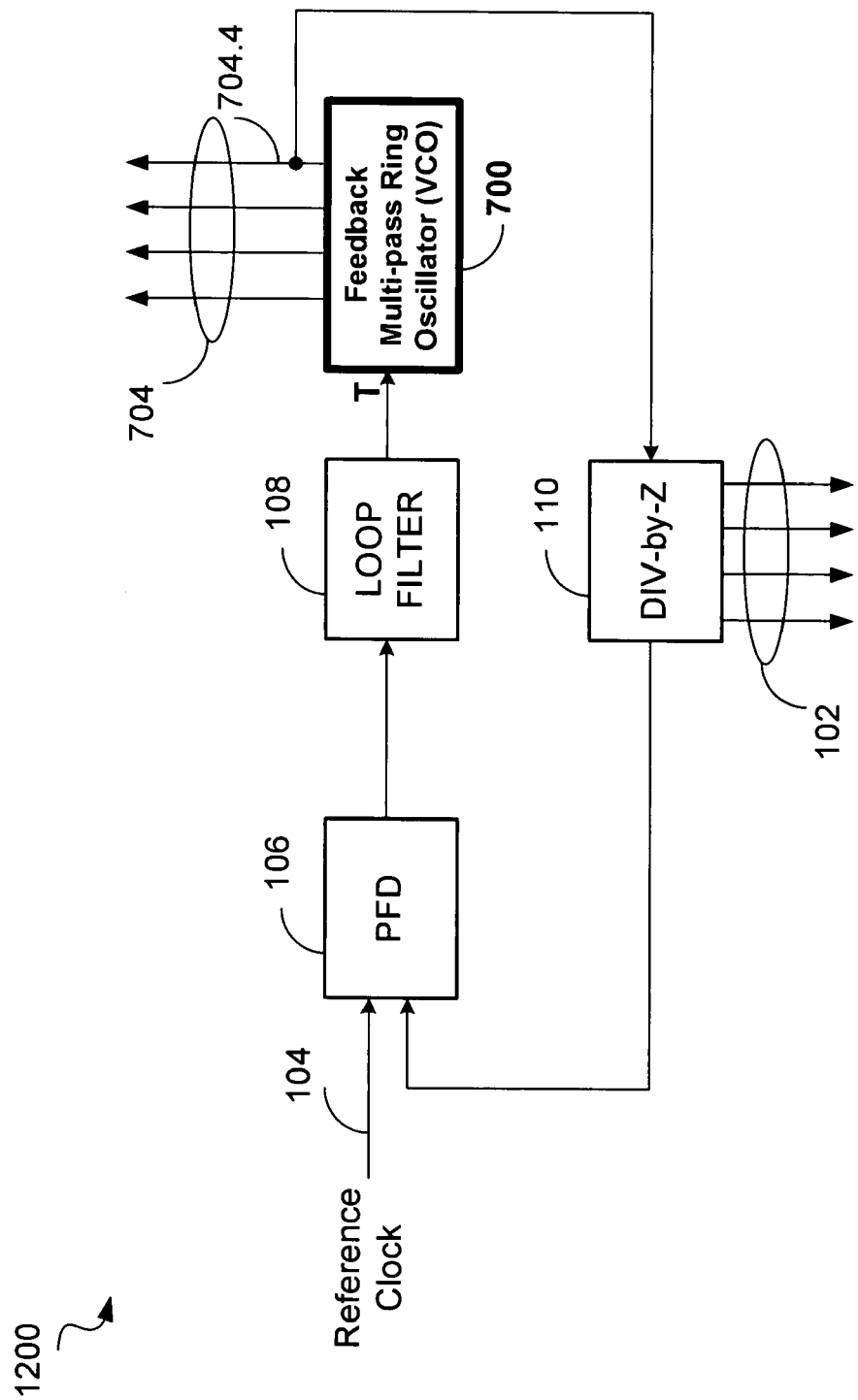
FIG. 12 is a block diagram of a PLL 1200 for generating a multiphase clock, incorporating an embodiment of the invention.

FIG. 12 is a block diagram of a PLL 1200 for tracking the reference clock 104 and generating a multiphase clock output, incorporating an embodiment of the invention. The PLL 1200 is similar to the PLL 100 (FIG. 1), and may comprise the same phase/frequency detector (PFD) 106, the same loop filter 108, the same divide-by-Z circuit 110, but the conventional VCO 112 is replaced by an instance of an embodiment of the invention, i.e. the Feedback multipass Ring Oscillator 700. The tuning input T of the Feedback multipass Ring Oscillator 700 is connected to the output of the loop filter 108, and the DIV-by-Z circuit 110 is driven by a selected one output of the Feedback multipass Ring Oscillator 700, for example the output 704.4. The multiphase clock output 102 may be generated by decoding the states of the divide-by-Z circuit 110. An advantageous alternative solution for generating a multiphase clock output is to obtain the clock phases (704) directly from the outputs 704.1 to 704.4 from the Feedback multipass Ring Oscillator 700.

Figure 1:
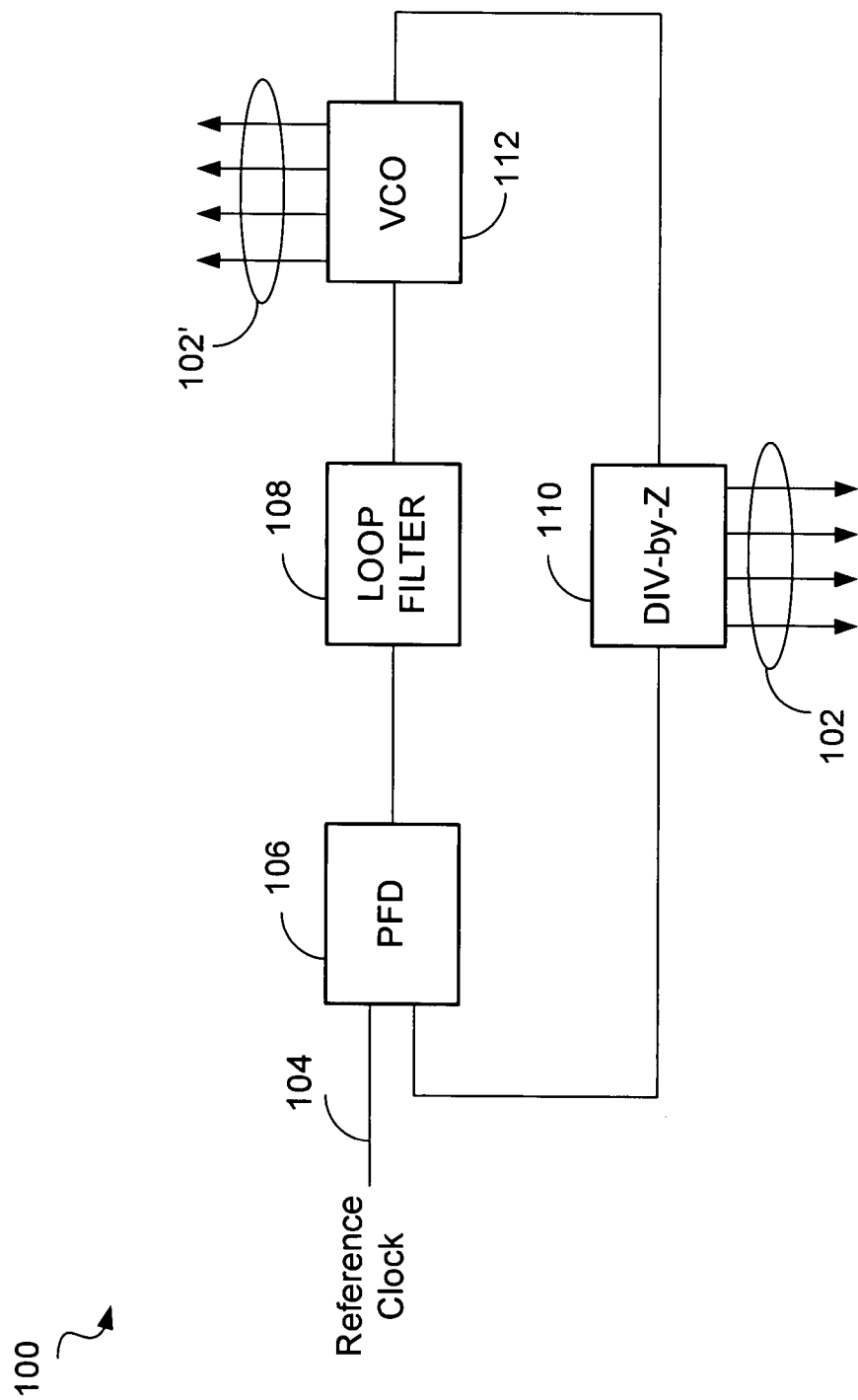
FIG. 1 is a block diagram of a conventional PLL 100 of the prior art.

Compared with the PLL 100 of FIG. 1, the PLL 1200 (FIG. 12) including the Feedback multipass Ring Oscillator 700 can obtain a much wider tracking range with substantially constant voltage swing, and lower cost because of the simplicity of the circuit. The PLL 1200 may thus be able to track the reference clock 104 over a wider range, assuming the PFD is dimensioned accordingly.

While the present invention was conceived to solve requirements of the application of multiple high speed serial links in a memory application, any VCO built in the form of the Feedback multipass Ring Oscillator 700 of the invention may be of great value in other applications in which a VCO with a wide tuning range is required, or in which a low cost and low power consumption is mandatory.

The Feedback multipass Ring Oscillator 700 of the invention may thus be embedded in high speed PLL designs that require a wide tuning range, but other applications are equally within the scope of the following claims.

Numerous modifications and variations of the present invention are possible in light of the above teachings. It is therefore to be understood that within the scope of the given system characteristics, the invention may be practiced otherwise than as specifically described herein.

What is claimed is:

1. A voltage controlled oscillator (VCO) including:
   a plurality N of amplifier stages, each amplifier stage comprising a differential output, a differential primary input, and a differential feedback input, and at least one of the amplifier stages including a differential tuning input, wherein:
   (a) each differential output is connected to the differential primary input of a different stage so as to form a ring of stages;
   (b) the differential feedback input of each stage is connected to the differential output of an immediately following stage in the ring; and
   (c) said at least one of the amplifier stages comprises:
      (i) a primary amplifier terminating the differential primary input and including a primary controllable gain function block and a first current source;
      (ii) a secondary amplifier terminating the differential feedback input and including a secondary controllable gain function block and a second current source;
      (iii) a common amplifier load section for combining the outputs of the primary amplifier and the secondary amplifier; and
      (iv) a tuning circuit terminating the differential tuning input and connected to the first and second current sources for adjusting gains of the primary and secondary amplifiers respectively;
      (v) the tuning circuit comprising a third current source and means for directing a fraction of the current from the third current source to one of the first and second current sources, and directing the remaining fraction of the current from the third current source to the other one of the first and second current sources, to control relative gains of the primary and secondary amplifiers, thereby controlling an oscillating frequency of the ring.

2. The VCO of claim 1, wherein the output of at least one of the amplifier stages is an inverting output.

3. The VCO of claim 1, wherein the plurality N=4, or greater.

4. The VCO of claim 1, wherein each amplifier stage has a differential tuning input.

5. The VCO of claim 1, wherein the immediately following stage is chosen so as to deliver a phase signal having a phase delay relative to the primary input, to the feedback input of the each amplifier stage.

6. The VCO of claim 5, wherein the phase delay is less or equal 90°.

7. A method of generating a variable frequency in a ring oscillator having N amplifier stages, the method comprising:
   inputting an output of each stage to a primary input of the next stage in the ring;
   inputting an output of a subsequent stage to a secondary input of the each stage so as to provide a feedback having a phase delay relative to the primary input;
   amplifying the primary input by a variable primary gain controlled by a primary controllable gain function block and a first current source;
   amplifying the secondary input by a variable secondary gain controlled by a secondary controllable gain function block and a second current souse;
   combining outputs of the primary amplifier and the secondary amplifier; and
   controlling the primary and secondary controllable gain function blocks with a control voltage by dividing a current from a tuning circuit comprising a third current source in a continuously adjustable proportion as a function of said control voltage, including directing a fraction of the current from the third current source to one of the first and second current sources and directing the remaining fraction of the current from the third current source to the other one of the first and second current sources, thereby controlling an oscillating frequency of the ring.

8. The method of claim 7, comprising providing the phase delay, which is less or equal 90°.

9. The method of claim 7, comprising selecting N=4, or greater.

10. A phase lock loop (PLL) including a voltage controlled oscillator (VCO), the VCO having a plurality N of amplifier stages, each amplifier stage comprising a differential output, a differential primary input, and a differential feedback input, and at least one of the amplifier stages including a differential tuning input, wherein:

the amplifier stages are arranged as follows:

each differential output is connected to the differential primary input of a different stage to form a ring of stages;

the differential feedback input of each stage is connected to the differential output of an immediately following stage in the ring; and at least one of the amplifier stages comprises:

a primary amplifier terminating the differential primary input and including a primary controllable gain function block and a first current source;

a secondary amplifier terminating the differential feedback input and including a secondary controllable gain function block and a second current source;

a common amplifier load section for combining the outputs of the primary amplifier and the secondary amplifier; and a tuning circuit terminating the differential tuning input and connected to the first and second current sources for adjusting gains of the primary and secondary amplifiers respectively;

the tuning circuit comprising a third current source and means for directing a fraction of the current from the third current source to one of the first and second current sources, and directing the remaining fraction of the current from the third current source to the other one of the first and second current sources, to control relative gains of the primary and secondary amplifiers, thereby controlling an oscillating frequency of the ring.

11. The PLL of claim 10, wherein the output of at least one of the stages of the VCO is an inverting output.

12. The PLL of claim 10, wherein the plurality N=4, or greater.

13. The PLL of claim 10, wherein each amplifier stage has a differential tuning input.

14. The PLL of claim 10, wherein the immediately following stage is chosen so as to deliver to the feedback input of the each stage a phase delayed signal having a phase delay relative to the primary input.

15. The PLL of claim 14, wherein the phase delay is less or equal 90°.

* * * * *